United States Patent [19]
Schenck

[11] Patent Number: 6,118,297
[45] Date of Patent: Sep. 12, 2000

[54] VOTING CIRCUIT AND METHOD

[75] Inventor: Stephen R. Schenck, McKinney, Tex.

[73] Assignee: Texas Instruments Incorporated, Dallas, Tex.

[21] Appl. No.: 09/211,907

[22] Filed: Dec. 15, 1998

Related U.S. Application Data

[60] Provisional application No. 60/068,583, Dec. 23, 1997.

[51] Int. Cl.[7] .................................................. H03K 19/23
[52] U.S. Cl. .................................. 326/35; 326/11; 327/63; 714/797
[58] Field of Search ................................. 326/35, 36, 16, 326/9, 11; 327/63, 355; 714/797

[56] References Cited

U.S. PATENT DOCUMENTS

| | | | |
|---|---|---|---|
| 3,900,741 | 8/1975 | Fletcher et al. | 327/292 |
| 4,001,605 | 1/1977 | Thomas et al. | 327/355 |
| 4,342,062 | 7/1982 | Larson | 361/93 |
| 4,587,445 | 5/1986 | Kanuma | 326/35 |
| 4,748,594 | 5/1988 | Iida | 365/200 |
| 4,924,120 | 5/1990 | Schenck | 307/542 |
| 4,959,563 | 9/1990 | Schenck | 307/448 |
| 5,066,872 | 11/1991 | Schenck | 307/443 |
| 5,118,971 | 6/1992 | Schenck | 307/443 |
| 5,220,208 | 6/1993 | Schenck | 307/443 |
| 5,784,386 | 7/1998 | Norris | 714/797 |
| 5,838,166 | 11/1998 | Nakamura | 326/36 |

*Primary Examiner*—Michael Tokar
*Assistant Examiner*—Daniel D. Chang
*Attorney, Agent, or Firm*—Robert D. Marshall, Jr.; W. James Brady, III; Frederick J. Telecky, Jr.

[57] ABSTRACT

A voting circuit (34) comprises a first variable delay (60) operable to receive a first set of signals in a clock signal and to determine a first delay based on the first set of signals. The first variable delay (60) generates a first delayed output in response to the first delay of the clock signal. A second variable delay (62) is operable to receive a second set of signals and a clock signal and to determine a second delay based on the second set of signals. The second variable delay (62) generates a second delayed output in response to the second delay of the clock signal. A latch (64) is connected to the first and second variable delays. The latch (64) is operable to receive the first and second delayed outputs and to generate a latched voting output in response to at least one of the first and second delayed outputs.

19 Claims, 1 Drawing Sheet

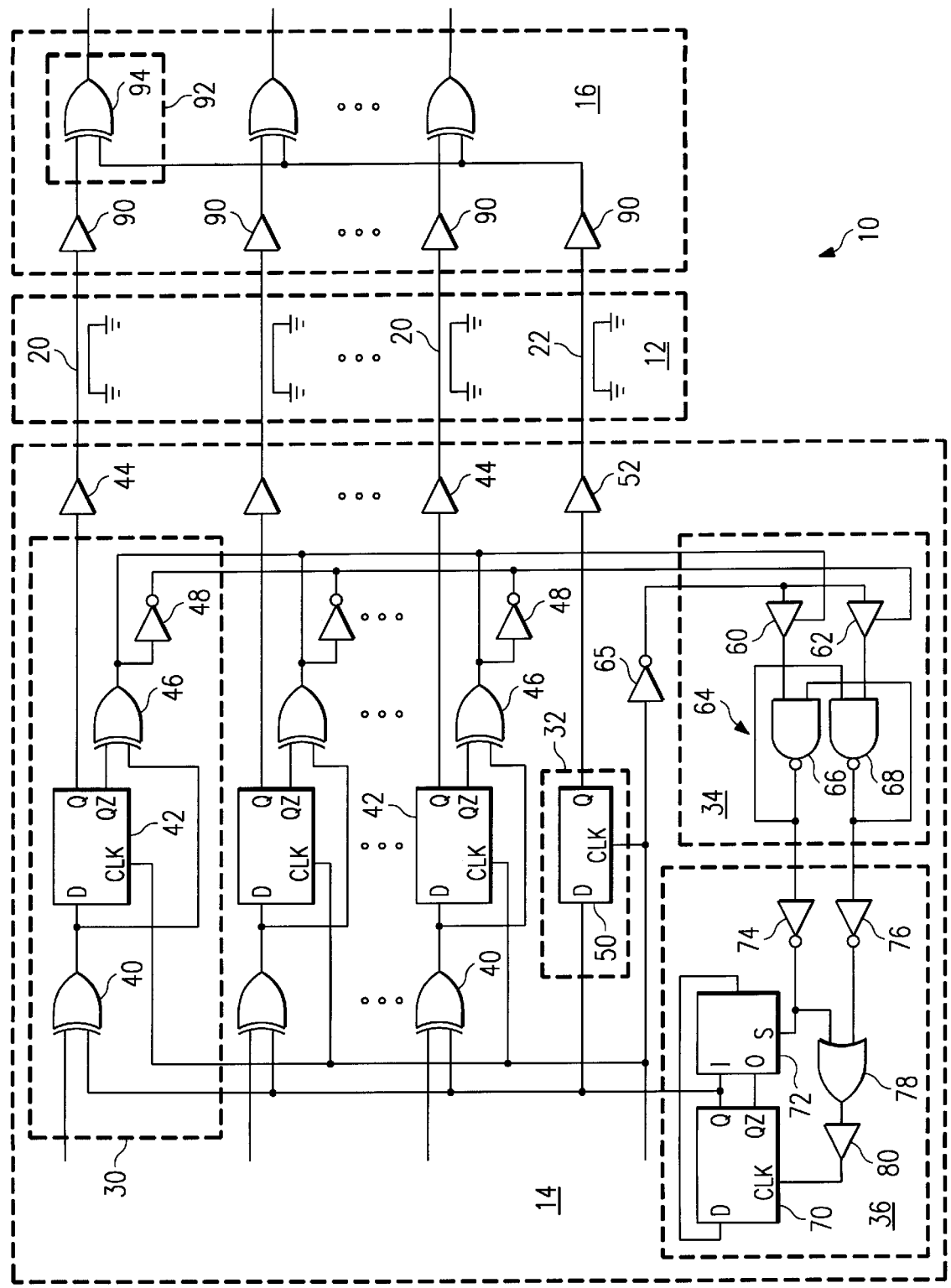

VOTING CIRCUIT AND METHOD

This application claims priority under 35 USC §119(e)(1) of Provisional Application Number 60/068,583 Dec. 23, 1997.

RELATED APPLICATIONS

This application is related to copending U.S. application Ser. No. 09/212,142, entitled "Method and System of Minimizing Simultaneous Switching Noise in an Electronic Device".

TECHNICAL FIELD OF THE INVENTION

This invention relates generally to the field of electronic devices, and more particularly to a voting circuit and method.

BACKGROUND OF THE INVENTION

Electronic devices may employ voting systems to accomplish various functions. Voting systems typically use software or logic gates to tabulate votes. Software, however, is too expensive and slow for many applications. The use of logic gates are also problematic due to the large number of gates required to test all permeations of a signal or system. This large number of logic gates is expensive to manufacture and requires an excessive amount of integrated circuit chip space. In addition, accessing a large number of gates is time consuming and may require several clock cycles.

SUMMARY OF THE INVENTION

Accordingly, a need has arisen in the art for an improved voting system. The present invention provides a voting circuit and method that substantially reduce or eliminate problems associated with prior voting systems.

In accordance with the present invention, a voting circuit comprises a first variable delay operable to receive a first set of signals and a clock signal and to determine a first delay based on the first set of signals. The first variable delay generates a first delayed output in response to the first delay of the clock signal. A second variable delay is operable to receive a second set of signals and a clock signal and to determine a second delay based on the second set of signals. The second variable delay generates a second delayed output in response to the second delay of the clock signal. A latch is connected to the first and second variable delays. The latch is operable to receive the first and second delayed outputs and to generate a latched voting output in response to at least one of the first and second delayed outputs.

More specifically, in accordance with one embodiment of the present invention, the latch may comprise a first NAND gate connected to the first variable delay and a second NAND gate connected to the second variable delay. The first NAND gate is operable to receive the first delayed output and a second NAND output of the second NAND gate and to generate a first NAND output. The second NAND gate is operable to receive the second delayed output and the first NAND output of the first NAND gate and to generate the second NAND output. One of the first and second NAND outputs comprise a latched voting output.

Technical advantages of the present invention include providing a voting circuit. In particular, the voting circuit may include a pair of variable delays and NAND gates operable to tabulate votes and generate a latched voting output. Accordingly, expensive software and complex logic structures comprising numerous gates need not be used. As a result, manufacturing costs are reduced and the speed of the electronic device is increased.

Other technical advantages of the present invention will be readily apparent to one skilled in the art from the following figures, descriptions, and claims.

BRIEF DESCRIPTION OF THE DRAWINGS

For a more complete understanding of the present invention and its advantages thereof, reference is now made to the following description taken in conjunction with the accompanying drawing, wherein like reference numerals represent like parts, in which:

The FIGURE is a block diagram illustrating a low noise system for communicating data on a data bus in accordance with one embodiment of the present invention.

DETAILED DESCRIPTION OF THE INVENTION

The preferred embodiments of the present invention and its advantages are best understood by referring now in more detail to the FIGURE in which like numerals refer to like parts. The FIGURE illustrates a low noise system for communicating data in accordance with one embodiment of the present invention. As described in more detail below, the low noise system may include a transmitting system operable to transmit data in a true or complementary state. The data may be transmitted in the true state when less than half of the data lines of a data bus need to switch from high to low or low to high. When the true state would require more than half of the data lines to switch, the data may be transmitted in the complementary state. In cases where half of the data lines need to switch for both the true and complementary states, the data may be transmitted in the previous state to prevent the parity line from switching. Thus, no more than half of the data lines need to be switched at any time to transmit data on the data bus. Accordingly, switching noise and power to operate the data bus are reduced.

The FIGURE is a block diagram illustrating a low noise system 10 for communicating data in an electronic device. The electronic device may comprise a television, radio, computer, telephone or any other type of device that transmits and receives data on a data bus. A data bus is a set of two or more hardware lines, wires, leads, traces or other conductors on which data is transmitted between components of the device.

Referring to the FIGURE, the low noise system 10 comprises a data bus 12 connecting a transmitting system 14 to a receiving system 16. In one embodiment, the transmitting system 14 may comprise part of an integrated circuit chip and the receiving system 16 may comprise part of a printed circuit board. In this embodiment, the integrated circuit chip may plug into the printed circuit board and the data bus 12 may be partially disposed on both the integrated circuit chip and the printed circuit board. It will be understood that the data bus 12, transmitting system 14 and receiving system 16 may form part of other components of the electronic device. Thus, for example, the transmitting and receiving systems 14 and 16 may form part of separate integrated circuit chips plugged into a common printed circuit board.

The data bus 12 comprises a plurality of data lines 20 and a parity line 22. The data and parity lines 20 and 22 may be conventionally grounded to allow each line to be switched as necessary from low to high or high to low. As described in more detail below, true or complementary data may be transmitted on the data lines 20 along with a parity signal on the parity line 22 identifying the true or complementary state of the transmitted data. As a result, no more than half of the data lines need to be switched from a previous state at any time to transmit data on the data bus.

In one embodiment, the data bus 12 may be an eight (8) bit bus. In this embodiment, the data bus 12 may comprise eight (8) data lines 20 in addition to the parity line 22. It will be understood that the data bus 12 may be otherwise sized without departing from the scope of the present invention. For example, the data bus may be a 16 bit bus, a 32 bit bus and the like.

The transmitting system 14 comprises a data line system 30 associated with each data line 20, a parity line system 32 associated with the parity line 22, a parity voting system 34 connected to the data line systems 30 and a parity latch system 36 connected to the parity voting system 34, the data line systems 30 and the parity line system 32. It will be understood that the components of the transmitting system 14 may be otherwise suitably combined or divided into these or other systems without departing from the scope of the present invention. Accordingly, the labels of data line system, parity line system, parity voting system and parity latch system are for illustrative purposes and may be varied without departing from the scope of the present invention.

The transmitting system 14 receives data sets to be transmitted on the data bus 12. The data sets may be received from a memory such as a DRAM, ROM and the like. The data sets include a plurality of data bits each associated with one of the data lines 20. A data bit is associated with a data line 20 in that the data bit will be transmitted on the data line 20 in a true or complementary state.

In the transmitting system 14, each data bit is received by the data line system 30 of the associated data line 20. In one embodiment, the data line system 30 comprises an adjustment exclusive-or (XOR) gate 40, data flip-flop 42, output driver 44, comparison exclusive-or (XOR) gate 46 and an inverter 48. In this embodiment, the adjustment XOR gate 40 receives the data bit. The adjustment XOR gate 40 also receives a parity signal and generates an adjusted data bit based on the data bit and parity signal. As described in more detail below, the parity signals are generated by the parity latch system 36. The parity signals may be true or complementary. A true value of the parity signal means that the data bits will be transmitted in the state in which they are received. Thus a logic zero (low) will be transmitted as a logic zero and a logic one (high) will be transmitted as a logic one. A complementary value of the parity signal means that the data bits will be transmitted in the opposite state from that in which they are received. Thus, a logic zero will be transmitted as a logic one and a logic one will be transmitted as a logic zero.

For the embodiment of the FIGURE, the parity signals generated by the parity latch system 36 are a logic zero when true and a logic one when complementary. Accordingly, when the parity signal is a logic zero, a logic one data bit will have a logic one adjusted data bit and a logic zero data bit will have a logic zero adjusted data bit. When the parity signal has a logic one value, a logic one data bit will have a logic zero adjusted data bit and a logic zero data bit will have a logic one adjusted data bit. Thus, when the parity signal is complementary, the adjustment XOR gate 40 changes the state of the data bit from logic one to logic zero or from logic zero to logic one.

The data flip-flop 42 receives the adjusted data bit generated by the adjustment XOR gate 40 at input (D) and a clock signal (CLK). In response to the clock signal, the data flip-flop 42 latches the adjusted data bit at output (Q) for transmission on the data line 20. In one embodiment, the data flip-flop 42 is a rising edge triggered flip-flop. In this embodiment, the adjusted data bit is latched at output (Q) in response to the rising edge of the clock signal. It will be understood that the adjusted data bit may be otherwise latched or stored by suitable means without departing from the scope of the present invention.

The adjusted data bit latched at output (Q) of the data flip-flop 42 is received by the output driver 44 and transmitted on the data line 20. Transmission of the adjusted data bit is simultaneous with transmission of the adjusted data bits of the other data lines 20 and the parity signal used to adjust the adjusted data bits. The parity signal is transmitted on the parity line 22. As described in more detail below, the parity signal is used by the receiving system 16 to decode the adjusted data bits to regenerate the data bits.

The data flip-flop 42 latches an inverse of the adjusted data bit at output (QZ) as a stored previously adjusted data bit. As described in more detail below, the stored previously adjusted data bit is used to determine a parity signal for a subsequent data set. The term previously adjusted data bit means information establishing the previously adjusted data bit. That information may be the data itself, an inverse of the data or other suitable information. Thus, the terms data or signal as used herein mean information establishing the data or signal.

Subsequent data sets are received by the transmitting system 14 after the adjusted data bits of the previous data set are latched by the data flip-flop 42. Thus, receipt of a subsequent data set will not interfere with transmission or storage of the previous data set. For the rising edge triggered flip-flop 42, the subsequent data set is preferably received immediately following the rising edge of the clock signal that latches the previous data set. This allows a maximum amount of time to determine the parity signal and adjust the data bit of the subsequent data set before they are latched by the rising edge triggered flip-flop 42. It will be understood that receipt of subsequent data sets may be otherwise suitably clocked without departing from the scope of the present invention.

The subsequent data set includes a plurality of data bits each received in an associated data line system 30 by the adjustment XOR gate 40 as previously described. The adjustment XOR gate 40 continues to receive the parity signal, which is a previous parity signal to the subsequent data set. Based on the data bit and the previous parity signal, the adjustment XOR gate 40 generates a signal used by the comparison XOR gate 46. The comparison XOR gate 46 compares the signal to the stored previously adjusted data bit and generates a comparison signal. The comparison signal represents whether the parity signal should be switched to prevent the data line 20 from switching. For the embodiment of the FIGURE, the comparison signal is a logic zero when the parity signal should be switched and a logic one when the parity signal should not be switched.

The inverter 48 receives the comparison signal and generates an inverted comparison signal. Thus, the inverted comparison signal also represents whether the parity signal should be switched to prevent the data line 20 from switching. The inverted comparison signal is a logic one when the parity signal should be switched and a logic zero when the parity signal should not be switched. As described in more detail below, the comparison signal and the inverted comparison signal generated by each of the line systems 30 are used by the parity voting system 34 and the parity latch system 36 to generate the parity signal for transmitting the subsequent data set. In particular, the parity signal is used by the adjustment XOR gates 40 to adjust the data bits of the subsequent data set. The parity signal is also transmitted with the adjusted data bits to allow the receiving system to decode the adjusted data bits and regenerate the data bits of the subsequent data set.

The parity line system 32 comprises a parity flip-flop 50 and an output driver 52. The parity flip-flop 50 receives the parity signal at input (D) and the clock signal (CLK). In response to the clock signal, the parity flip-flop 50 latches the parity signal at output (Q) for transmission on the parity line 22. In one embodiment, the parity flip-flop 50 is a rising edge triggered flip-flop. In this embodiment, the parity signal is latched at output (Q) in response to the rising edge of the clock signal. It will be understood that the parity signal may be otherwise suitably latched or stored without departing from the scope of the present invention.

The parity signal latched at output (Q) of the parity flip-flop 50 is received by the output driver 52 and transmitted on the parity line 22. Transmission of the parity signal is simultaneous with transmission of the adjusted data bits on the data lines 20. As described in more detail below, the parity signal is used by the receiving system 16 to decode the adjusted data bits transmitted on the data bus 12.

The parity voting system 34 comprises a first variable delay 60, a second variable delay 62 and a voting latch 64. The first and second variable delays 60 and 62 operate on a voting clock signal. For the embodiment of the FIGURE, the voting clock signal is generated by an inverter 65 connected to the clock signal used by the data flip-flops 42. Thus, the voting clock signal is the inverse of the clock signal. It will be understood that the first and second variable delays 60 and 62 may be otherwise suitably clocked without departing from the scope of the present invention.

The first variable delay 60 is connected to the comparison XOR gates 46 to receive the comparison signals. The first variable delay 60 determines a first delay based on the comparison signals and generates a first delay output in response to the first delay of the voting clock signal. For the embodiment of the FIGURE, the first variable delay 60 delays the voting clock signal by one increment for each logic low comparison signal.

The second variable delay 62 is connected to the invertors 48 to receive the inverted comparison signals. The second variable delay 62 determines a second delay based on the inverted comparison signals and generates a second delay output in response to the second delay of the voting clock signal. For the embodiment of the FIGURE, the second variable delay 62 delays the variable clock signal by one increment for each logic low inverted comparison signal. Thus, both the first and second variable delays 60 and 62 delay the voting clock signal one increment for each logic low input Sinai.

As previously described, the comparison signal generated by each line system 30 is a logic zero when the parity signal should be switched. Thus, each comparison signal that is a logic one is a vote for the parity signal to not switch and each logic zero comparison signal is a vote for the parity signal to switch. The inverted comparison signals are the inverse of the comparison signals. As a result, the inverted comparison signal is a logic zero when the parity signal should not be switched. Thus, each comparison signal that is a logic zero is a vote for the parity signal to not switch and each logic one comparison signal is a vote for the parity signal to switch.

Because the comparison signals and inverted comparison signals are the inverse of each other, the number of logic one comparison signals is equal to the number of logic zero inverted comparison signals and the number of logic zero comparison signals is equal to the number of logic one inverted comparison signals. As previously described, both the first and second variable delays 60 and 62 delay the voting clock signal by one increment for each logic low input signal. Thus, if a majority of the comparison signals are logic ones, which is a vote to not switch the parity signal, the first variable delay 60 will delay the voting clock signal for a shorter period of time than the second variable delay because the majority of the inverted comparison signals will be logic zeros. Accordingly, generation of the first delayed output by the first variable delay 60 prior to generation of the second delayed output by the second variable delay 62 indicates that the parity signal will not be switched. If the majority of the comparison signals are logic zeros, which is a vote to switch the parity signal, the first variable delay 60 will delay the voting clock signal for a longer period of time than the second variable delay 62 because of the majority of the inverted comparison signals will be logic ones. Accordingly, generation of the second delayed output by the second variable delay 62 prior to generation of the first delayed output by the first variable delay 60 indicates that the parity signal will be switched.

For an embodiment in which the data bus 12 has an even number of data lines 20, one of the variable delays 60 or 62 may include a supplemental delay to prevent the first and second delays from being substantially equal. For the embodiment of the FIGURE, the second variable delay 62 includes a supplemental delay having the value of one-half of the delay increment of a logic low input signal. Thus, if an equal number of comparison signals and inverted comparison signals are logic ones and zeros, the supplemental delay will extend the second delay and allow the first variable delay 60 to generate the first delayed output before the second variable delay 62 generates the second delayed output. As a result, when the comparison signals and inverted comparison signals have an equal number of logic ones and zeros, the parity signal will not switch.

The voting latch 64 is connected to the first and second variable delays 60 and 62 and is operable to generate a latch voting output in response to the first and the second delayed outputs. In one embodiment, the voting latch 64 comprises a first NAND gate 66 and a second NAND gate 68. The first NAND gate 66 is connected to the first variable delay 60 and the second NAND gate 68. The first NAND gate 66 receives the first delayed output generated by the first variable delay 60 and a second NAND output generated by the second NAND gate 68 and generates a first NAND output. The second NAND gate 68 is connected to the second variable delay 62 and the first NAND gate 66. The second NAND gate 68 receives the second delayed output and the first NAND output generated by the first NAND gate 66 and generates the second NAND output.

The first and second NAND outputs are both initially a logic one. In response to the first NAND gate 66 receiving the first delayed output prior to the second NAND gate 68 receiving the second delayed output, the first NAND output goes to a logic zero and latches the second NAND output at a logic one. Thus, even when the second NAND gate 68 receives the second output signal, the second NAND output will remain at a logic one. For the embodiment of the FIGURE, when the first NAND output is a logic zero and the second NAND output is a logic one, the parity signal will not switch. In response to the second NAND gate 68 receiving the second delayed output prior to the first NAND gate 66 receiving the first delayed output, the second NAND output goes a logic zero and latches the first NAND output at a logic one. Thus, even when the first NAND gate 66 receives the first output signal, the first NAND output will remain at a logic one. For the embodiment of the FIGURE, when the first NAND output is a logic one and the second NAND output is a logic zero, the parity signal will switch. Either the first NAND output or the second NAND output may be used as a latched voting output from which the parity signal is generated.

Accordingly, the data line systems 30 each vote on whether the parity signal should switch. The parity voting system 34 receives and tabulates the votes to determine if the parity signal will switch. In accordance with one aspect of the invention, the parity voting system 34 is a voting circuit that efficiently determines and latches the voting output with minimal components. In particular, the voting circuit need only include a pair of variable delays and NAND gates. Accordingly, expensive software or complex logic structures comprising numerous gates need not be used. As a result, manufacturing costs are reduced and speed of data transmission is increased. It will be understood that the voting circuit of the present invention may be used in other suitable applications.

The parity latch system 36 is connected to the parity voting system 34 to receive the latched voting output. As described in more detail below, the parity latch system 36 generates the parity signal based on the latched voting output. In one embodiment, the parity latch system 36 comprises a parity latch flip-flop 70 and a multiplexer 72. In this embodiment, the parity signal is generated by the multiplexer 72 and latched by the parity latch flip-flop 70. It will be understood that the parity signal may be otherwise suitably generated, latched or stored without departing from the scope of the present invention.

The parity latch flip-flop 70 receives the parity signal generated by the multiplexer 72 at input (D) and a parity latch clock signal (CLK). In response to the parity latch clock signal, the parity latch flip-flop 70 latches the parity signal at output (Q) for use by the data and parity line systems 30 and 32 and the inverse of the parity signal at inverse output (QZ).

The multiplexer 72 receives the output (Q) of the parity latch flip-flop 70 as a first input, the inverse output (QZ) of the parity latch flip-flop 70 as a second input and the latched voting output as a select input (S). In response to the select input, the multiplexer 72 selects one of the first and second inputs as the parity signal. For the embodiment of the FIGURE, the latched voting output is the first NAND output. The first NAND output is connected to the multiplexer 72 through a first inverter 74. In this embodiment and as previously described, the parity signal is a logic zero when true data is to be transmitted and a logic one when complementary data is to be transmitted.

In one embodiment, the parity latch system 36 comprises a second inverter 76, an OR gate 78 and a buffer 80 to generate the parity latch clock signal based on the first and second NAND outputs. In this embodiment, the second inverter 76 inverts the second NAND output. The OR gate is connected to the first and second inverters 74 and 76 to receive the first inverted NAND output and the second inverted output. The OR gate 78 generates the parity latch clock signal based on the inverted first and second NAND outputs. The buffer 80 is connected between the OR gate 78 and the parity latch flip-flop 70 to delay the parity latch clock signal to allow the multiplexer 72 to receive the latched voting output and to select one of the output and the inverse output of the parity latch flip-flop 70 as the parity signal in response to the latched voting output and the parity latch flip-flop 70 to receive the parity signal prior to receiving the parity latch clock signal. It will be understood that the parity latch system 36 may be otherwise suitably clocked without departing from the scope of the present invention.

As previously described, the parity signal is received by the XOR gate 40 and used to generate the adjusted data bits of the subsequent data set. The adjusted data bits are received by the data flip-flops 42 and latched at output (Q) for transmission on the data lines 20. Each data flip-flop 42 also latches an inverse of the adjusted data bits at output (QZ) as the stored previously adjusted data bit for a next subsequent data set. The output drivers 44 transmit the adjusted data bits to the receiving system 16 on the data lines 20.

The receiving system 16 comprises an input driver 90 connected to each of the data lines 20 and to the parity line 22. The input drivers 90 receive the adjusted data bits and the parity signal and pass an adjusted data bit and the parity signal to a decode system 92 associated with each data line 20. It will be understood that the receiving system 16 may otherwise suitably receive the adjusted data bits and the parity signal without departing from the scope of the present invention.

In one embodiment, the decode system 92 comprises a decode exclusive-or (XOR) gate 94. In this embodiment, the decode XOR gate 94 receives the adjusted data bit of the associated data line 20 and the parity signal and decodes the adjusted data bit based on the adjusted data bit and the parity signal to regenerate the data bit of the data line 20. For a true parity signal, a logic zero adjusted data bit is decoded to a logic zero data bit and a logic one adjusted data bit is decoded to a logic one data bit. Conversely, for a complementary parity signal, a logic zero adjusted data bit is decoded to a logic one data bit and a logic one adjusted data bit is decoded to a logic zero data bit. Thus, data is be transmitted in the true state when less than half of the data lines of a data bus need to switch from high to low or low to high. When the true state would require more than half of the data lines to switch, the data may be transmitted in the complementary state. In cases where half of the data lines need to switch for both the true and complementary states, the data may be transmitted in the previous state to prevent the parity line from switching. As a result, no more than half of the data lines need to be switched at any time to transmit data on the data bus. Accordingly, switching noise and power to operate the data bus are reduced. Although the present invention has been described with several embodiments, various changes and modifications may be suggested to one skilled in the art. It is intended that the present invention encompass such changes and modifications as fall within the scope of the appended claims.

What is claimed is:

1. A voting circuit, comprising:
    a first variable delay operable to receive a first set of signals and a clock signal, determine a first delay based on the first set of signals and generate a first delayed output in response to the first delay of the clock signal;
    a second variable delay operable to receive a second set of signals and the clock signal, determine a second delay based on the second set of signals and generate a second delayed output in response to the second delay of the clock signal; and a latch connected to the first and second variable delays, the latch operable to receive the first and second delayed outputs and to generate a latched voting output in response to at least one of the first and second delayed outputs.

2. The circuit of claim 1, wherein the second set of signals is the inverse of the first set of signals.

3. The circuit of claim 1, one of variable delays further comprising a supplemental delay operable to prevent the first and second delays from being substantially equal.

4. The circuit of claim 1, further comprising:

the first variable delay operable to delay the clock signal for a defined period of time for each high signal in the first set of signals; and the second variable delay operable to delay the clock signal for a defined period of time for each high signal in the second set of signals.

5. The circuit of claim 1, the latch further comprising:

a first NAND gate connected to the first variable delay, the first NAND gate operable to receive the first delayed output and a second NAND output of a second NAND gate and to generate a first NAND output;

the second NAND gate connected to the second variable delay, the second NAND gate operable to receive the second delayed output and the first NAND output of the first NAND gate and to generate the second NAND output; and wherein one of the first and second NAND outputs comprises the latched voting output.

6. The circuit of claim 5, further comprising the first NAND output comprising a first value in response to the first NAND gate receiving the first delayed output prior to the second NAND gate receiving the second delayed output and comprising a second value in response to the second NAND gate receiving the second delayed output prior to the first NAND gate receiving the first delayed output.

7. The circuit of claim 6, further comprising the second NAND output comprising a value corresponding to the second value in response to the second NAND gate receiving the second delayed output prior to the first NAND gate receiving the first delayed output and comprising a value corresponding to the first value in response to the first NAND gate receiving the first delayed output prior to the second NAND gate receiving the second delayed output.

8. An integrated circuit, comprising:

a first variable delay operable to receive a first set of signals and a clock signal, determine a first delay based on the first set of signals and generate a first delayed output in response to the first delay of the clock signal;

a second variable delay operable to receive a second set of signals and the clock signal, determine a second delay based on the second set of signals and generate a second delayed output in response to the second delay of the clock signal; and a latch connected to the first and second variable delays, the latch operable to receive the first and second delayed outputs and to generate a latched voting output in response to at least one of the first and second delayed outputs.

9. The integrated circuit of claim 8, wherein the second set of signals is the inverse of the first set of signals.

10. The integrated circuit of claim 8, one of variable delays further comprising a supplemental delay operable to prevent the first and second delays from being substantially equal.

11. The integrated circuit of claim 8, further comprising:

the first variable delay operable to delay the clock signal for a defined period of time for each high signal in the first set of signals; and the second variable delay operable to delay the clock signal for a defined period of time for each high signal in the second set of signals.

12. The integrated circuit of claim 8, the latch further comprising:

a first NAND gate connected to the first variable delay, the first NAND gate operable to receive the first delayed output and a second NAND output of a second NAND gate and to generate a first NAND output;

the second NAND gate connected to the second variable delay, the second NAND gate operable to receive the second delayed output and the first NAND output of the first NAND gate and to generate the second NAND output; and one of the first and second NAND outputs comprises the latched voting output.

13. The integrated circuit of claim 12, further comprising the first NAND output comprising a first value in response to the first NAND gate receiving the first delayed output prior to the second NAND gate receiving the second delayed output and comprising a second value in response to the second NAND gate receiving the second delayed output prior to the first NAND gate receiving the first delayed output.

14. The integrated circuit of claim 13, further comprising the second NAND output comprising a value corresponding to the second value in response to the second NAND gate receiving the second delayed output prior to the first NAND gate receiving the first delayed output and comprising a value corresponding to the first value in response to the first NAND gate receiving the first delayed output prior to the second NAND gate receiving the second delayed output.

15. A method of tabulating votes, comprising the steps of:

receiving a first set of signals;

receiving a clock signal;

receiving a second set of signals;

determining a first delay of a first variable delay based on the first set of signals;

generating a first delayed output of the first delay in response to the first delay of the clock signal;

determining a second delay of a second variable delay based on the second set of signals;

generating a second delayed output of the second delay in response to the second delay of the clock signal; and generating a latched voting output in response to at least one of the first and second delayed outputs.

16. The method of claim 15, wherein the second set of signals is the inverse of the first set of signals.

17. The method of claim 15, further comprising the step of supplementally delaying one of variable delays to prevent the first and second delays from being substantially equal.

18. The method of claim 1, further comprising the step of:

delaying the clock signal for a defined period of time in the first variable delay for each high signal in the first set of signals; and delaying the clock signal for a defined period of time in the second variable delay for each high signal in the second set of signals.

19. The method of claim 15, further comprising the steps of:

receiving the first delayed output and a second NAND output of a second NAND gate at a first NAND gate;

generating a first NAND output based on the first delayed output and the second NAND output;

receiving the second delayed output and the first NAND output of the first NAND gate at the second NAND gate;

generating a second NAND output based on the second delayed output and the first NAND output; and wherein one of the first and second NAND outputs comprises the latched voting output.

* * * * *